US010309635B1

(12) United States Patent
Warner et al.

(10) Patent No.: US 10,309,635 B1
(45) Date of Patent: Jun. 4, 2019

(54) DAMAGED CONNECTION DETECTION (71) Applicant: Valeo North America, Inc., Troy, MI (US)

(72) Inventors: Gavin Warner, Seymour, IN (US); Julien Hemon, Seymour, IN (US); Jonathan Blandin, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 0 days.

(21) Appl. No.: 15/849,402

(22) Filed: Dec. 20, 2017

(51) Int. Cl.
| | |
|---|---|
| *F21V 25/02* | (2006.01) |
| *H05K 1/02* | (2006.01) |
| *F21S 41/19* | (2018.01) |
| *F21V 23/00* | (2015.01) |
| *F21V 29/508* | (2015.01) |
| *F21V 29/70* | (2015.01) |
| *F21W 103/35* | (2018.01) |
| *F21W 103/20* | (2018.01) |
| *F21Y 115/10* | (2016.01) |

(52) U.S. Cl.
CPC ............ *F21V 25/02* (2013.01); *F21S 41/192* (2018.01); *F21V 23/002* (2013.01); *F21V 23/005* (2013.01); *F21V 29/508* (2015.01); *F21V 29/70* (2015.01); *H05K 1/0203* (2013.01); *H05K 1/0268* (2013.01); *F21W 2103/20* (2018.01); *F21W 2103/35* (2018.01); *F21Y 2115/10* (2016.08); *H05K 2201/066* (2013.01); *H05K 2201/1028* (2013.01); *H05K 2201/10106* (2013.01)

(58) Field of Classification Search
CPC .... F21S 48/335; F21Y 2101/02; F21V 29/004
USPC ........................................................ 362/547
See application file for complete search history.

(56) References Cited

U.S. PATENT DOCUMENTS

| | | | | |
|---|---|---|---|---|
| 5,280,409 A | * | 1/1994 | Selna ................... | H01L 23/4006 174/16.3 |
| 6,639,360 B2 | | 10/2003 | Roberts et al. | |
| 8,803,183 B2 | | 8/2014 | Chang et al. | |
| 2008/0073623 A1 | * | 3/2008 | Wang ..................... | H01B 3/006 252/567 |
| 2008/0305579 A1 | | 12/2008 | Lin et al. | |
| 2009/0225563 A1 | * | 9/2009 | Yamamoto .............. | F21S 41/17 362/519 |
| 2012/0074846 A1 | | 3/2012 | Marreiro et al. | |

(Continued)

*Primary Examiner* — Ahshik Kim
(74) *Attorney, Agent, or Firm* — Oblon, McClelland, Maier & Neustadt, L.L.P.

(57) ABSTRACT

A circuitry assembly including an electrical component, a peripheral circuitry that supports the electrical component, a support assembly affixed to the peripheral circuitry to evacuate heat excess generated by the electrical component and the peripheral circuitry, a main circuitry separated from the support assembly by a spacing, the main circuitry having a plurality of detection bands, and a plurality of ribbons electrically connecting the peripheral circuitry with the main circuitry and deformable between an undamaged state and a damaged state, wherein in the undamaged state the plurality of ribbons steps over the spacing and the plurality of detection bands and in the damaged state at least one ribbon of the plurality of ribbons contacts at least one detection band of the plurality of detection bands and generate a short circuit.

20 Claims, 5 Drawing Sheets

(56) References Cited

U.S. PATENT DOCUMENTS

2013/0207642 A1\* 8/2013 Maruyama ............. G01R 1/206
324/123 R
2013/0253302 A1 9/2013 Eckert et al.

\* cited by examiner

DAMAGED CONNECTION DETECTION

BACKGROUND

Field of the Disclosure

This disclosure relates generally to improvements to a connector of an electric or electronic circuit. More particularly the present disclosure relates to providing detection of damaged connections.

Description of the Related Art

In today's automotive industry, lighting systems rely heavily on circuitry that control operations and functionalities of lighting sources of the lighting systems based on driving needs and/or conditions. For example, this circuitry can be responsible for detecting a low level of light intensity and activating head lights, detecting braking and activating braking lights, and/or detecting turning and activation turning lights.

This circuitry is often connected to key electronic elements, e.g. lighting sources controlled by this circuitry, with electrical connections that can easily be damaged, e.g. bent, smashed, crushed, or the like, during shocks and/or stresses inflicted on the lighting systems that can unintentionally occur during manipulations, e.g. assembly, part replacement, storage, and/or transport, vehicle usages, e.g. engine vibrations, road shocks, collisions, and/or heavy braking, or any other activities performed on or around the lighting system. Such damages can generate electrical disconnection problems that can cause the lighting systems to malfunction or even become inoperative.

Identifying exactly where and which electrical connection has been damaged in the lighting systems can be difficult as the lighting systems are often confined in small spaces and the circuitry and/or the damaged connections are not directly visible and/or detectable with the naked eye.

Thus, a lighting system that overcomes the above limitations of electrical disconnection detection is needed.

SUMMARY

Accordingly, one of the objects of the present disclosure is to provide a light assembly that overcomes the above limitations by generating a detectable short circuit when an electrical connection is damaged.

In one non-limiting illustrative example, a circuitry assembly is presented. The circuit assembly includes an electrical component, a peripheral circuitry that supports the electrical component, a support assembly affixed to the peripheral circuitry to evacuate heat excess generated by the electrical component and the peripheral circuitry, a main circuitry separated from the support assembly by a spacing, the main circuitry having a plurality of detection bands, and a plurality of ribbons electrically connecting the peripheral circuitry with the main circuitry and deformable between an undamaged state and a damaged state, wherein in the undamaged state the plurality of ribbons steps over the spacing and the plurality of detection bands and in the damaged state at least one ribbon of the plurality of ribbons contacts at least one detection band of the plurality of detection bands and generate a short circuit.

In one aspect, the support assembly is made of a metallic alloy.

In one aspect, each ribbon of the plurality of ribbons is a bare electrical conductor.

In one aspect, the bare electrical conductor is made of a malleable material.

In one aspect, each detection band of the plurality of detection bands has a shape that follows the spacing.

In one aspect, each detection band has a semi-annular shape.

In one aspect, each detection band is characterized by a curvilinear length between 20% and 200% of a length of each ribbon of the plurality of ribbons.

In one aspect, the electrical component is a light source.

In one non-limiting illustrative example, a light assembly is presented. The light assembly includes a light source, a peripheral circuitry that supports the light source, a main circuitry separated from the support assembly by a spacing, the main circuitry having a plurality of detection bands, and a plurality of ribbons electrically connecting the peripheral circuitry with the main circuitry and deformable between an undamaged state and a damaged state, wherein in the undamaged state the plurality of ribbons steps over the spacing and the plurality of detection bands and in the damaged state at least one ribbon of the plurality of ribbons contacts at least one detection band of the plurality of detection bands and generate a short circuit.

In one aspect, each ribbon of the plurality of ribbons is a bare electrical conductor.

In one aspect, the bare electrical conductor is made of a malleable material.

In one aspect, each detection band of the plurality of detection bands has a shape that follows the spacing.

In one aspect, each detection band has a semi-annular shape.

In one aspect, each detection band is characterized by a curvilinear length between 20% and 200% of a length of each ribbon of the plurality of ribbons.

In one non-limiting illustrative example, a lighting system for vehicle is presented. The lighting system for vehicle includes a light source, a peripheral circuitry that supports the light source, a support assembly affixed to the light source, a main circuitry separated from the support assembly by a spacing, a power source coupled to the main circuitry to provide light functionality to the light source, a plurality of detection bands, a diagnostic tool operatively coupled to the plurality of detection bands, and a plurality of ribbons electrically connecting the peripheral circuitry with the main circuitry and deformable between an undamaged state and a damaged state, wherein in the undamaged state the plurality of ribbons steps over the spacing and the plurality of detection bands and in the damaged state at least one ribbon of the plurality of ribbons contacts at least one detection band of the plurality of detection bands and generate a short circuit detectable by the diagnostic tool.

In one aspect, each ribbon of the plurality of ribbons is a bare electrical conductor.

In one aspect, the bare electrical conductor is made of a malleable material.

In one aspect, each detection band of the plurality of detection bands has a shape that follows the spacing.

In one aspect, each detection band has a semi-annular shape.

In one aspect, each detection band is characterized by a curvilinear length between 20% and 200% of a length of each ribbon of the plurality of ribbons.

The forgoing general description of the illustrative implementations and the following detailed description thereof are merely exemplary aspects of the teachings of this disclosure, and are not restrictive.

BRIEF DESCRIPTION OF THE DRAWINGS

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying graphs and figures are for illustration purposes only and may or may not represent actual or preferred values or dimensions. Where applicable, some or all features may not be illustrated to assist in the description of underlying features. In the drawings.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details. In some instances, well-known structures and components may be shown in block diagram form in order to avoid obscuring the concepts of the disclosed subject matter.

It is to be understood that terms such as "front," "rear," and the like that may be used herein merely describe points of reference and do not necessarily limit embodiments of the present disclosure to any particular orientation or configuration. Furthermore, terms such as "first," "second," "third," etc., merely identify one of a number of portions, components, and/or points of reference as disclosed herein, and likewise do not necessarily limit embodiments of the present disclosure to any particular configuration or orientation.

Furthermore, the terms "approximately," "proximate," "minor," and similar terms generally refer to ranges that include the identified value within a margin of 20%, 10% or preferably 5% in certain embodiments, and any values therebetween.

Figure 1:
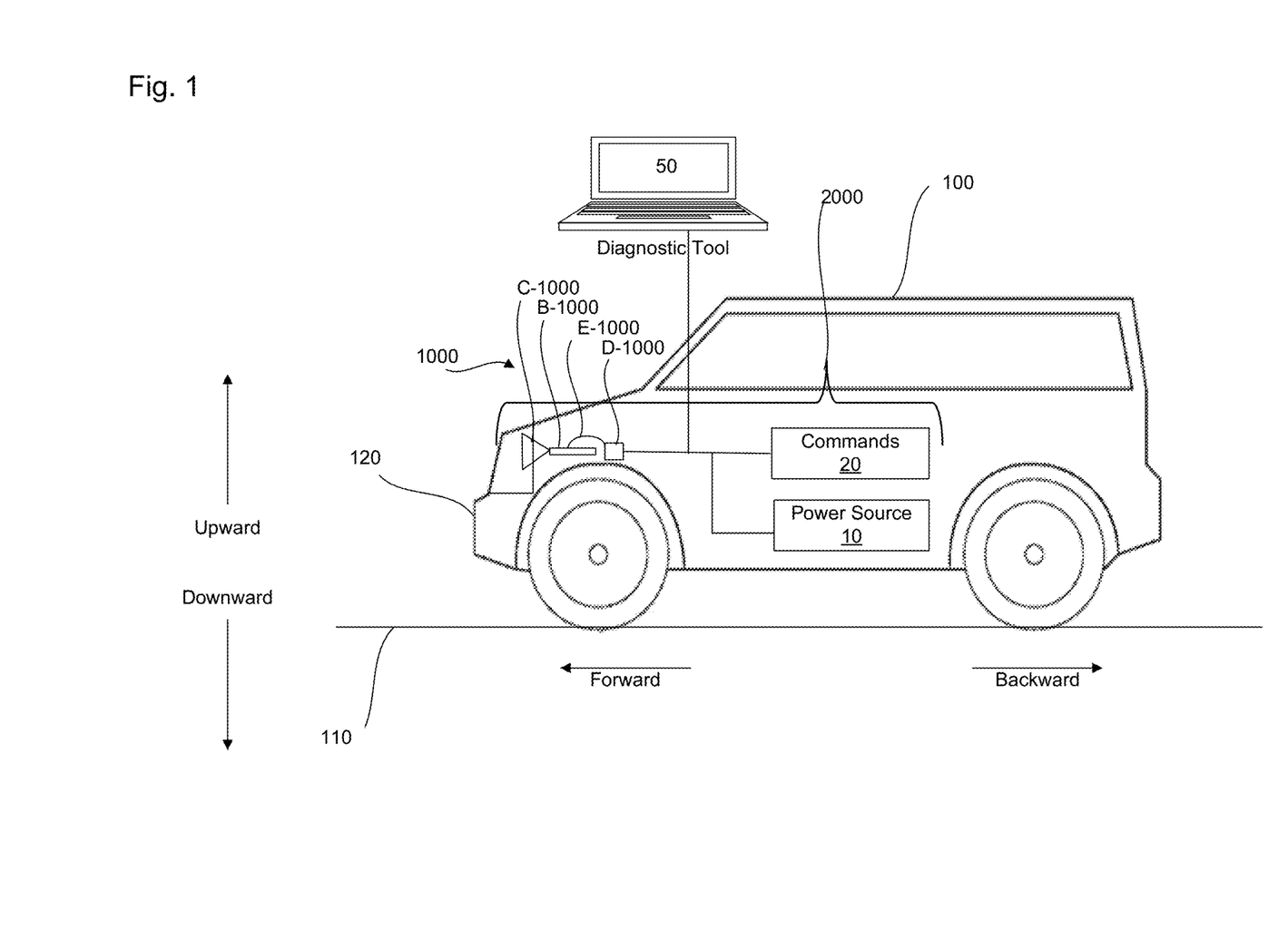
FIG. 1 is a side view of a lighting system of a vehicle, according to certain aspects of the disclosure.

The lighting system 2000 of a vehicle 100 can include a power source 10, e.g. battery, alternator, or the like, that provides an input power, commands 20, e.g. light switch, turn signal, braking, or the like, that provide actuation signals commensurate with lighting functions, e.g. daytime running light (DRL), high beam light, turning, braking light, or the like, a light assembly 1000 mounted into a housing 1100 that receives the input power and the actuation signals and provides lights according to the actuation signals.

In addition, the lighting system 2000 and/or the light assembly 1000 can be operatively coupled to a diagnostic tool 50 to perform diagnostics, short circuit detections, and/or programming/updating functions on the lighting system 2000 and/or the light assembly 1000. The diagnostic tool 50 can be any type of circuitry, e.g. computer, processors, with software instructions, e.g. Exxotest® software, that performs diagnostics and/or maintenance functionalities, e.g. short circuit detection, booting, tests, programming, or the like, to make sure that the lighting system 2000 operates accordingly to predetermined specifications and/or regulations.

During shocks and/or stresses inflected on the lighting system 2000 that can unintentionally occurred during manipulations, e.g. assemblage, part replacement, storage, and/or transport, vehicle usages, e.g. engine vibrations, road shocks, collisions, and/or heavy braking, or any other activities performed on or around the lighting system 2000, electrical connections such as ribbons E-1000 inside the light assembly 1000 can be damaged, e.g. bent, smashed, crushed, or the like, which can generate electrical disconnection problems causing the lighting system 2000 to malfunction or even become inoperative.

Identifying exactly where and which electrical connection has been damaged in the light assembly 1000 can be difficult as the light assembly 1000 and/or the damaged connections are not directly visible and/or detectable.

The light assembly 1000 of the present disclosure provides a reliable and efficient way to detect where and which electrical connection has been damaged by generating a detectable short circuit.

As used herein, the terms "lower" and/or "downward" refer to the region of the light assembly 1000 closest to a ground surface 110 on which the vehicle 100 is driving, the term "upper" and/or "upward" refer to the region of the light assembly 1000 farthest from the ground surface 110, the terms "front" and/or "forward" refer to the region of the light assembly 1000 closest to a bumper 120 of the vehicle 100, the terms "back" and/or "backward" refer to the region of the light assembly 1000 farthest from the bumper 120.

Figure 2A:
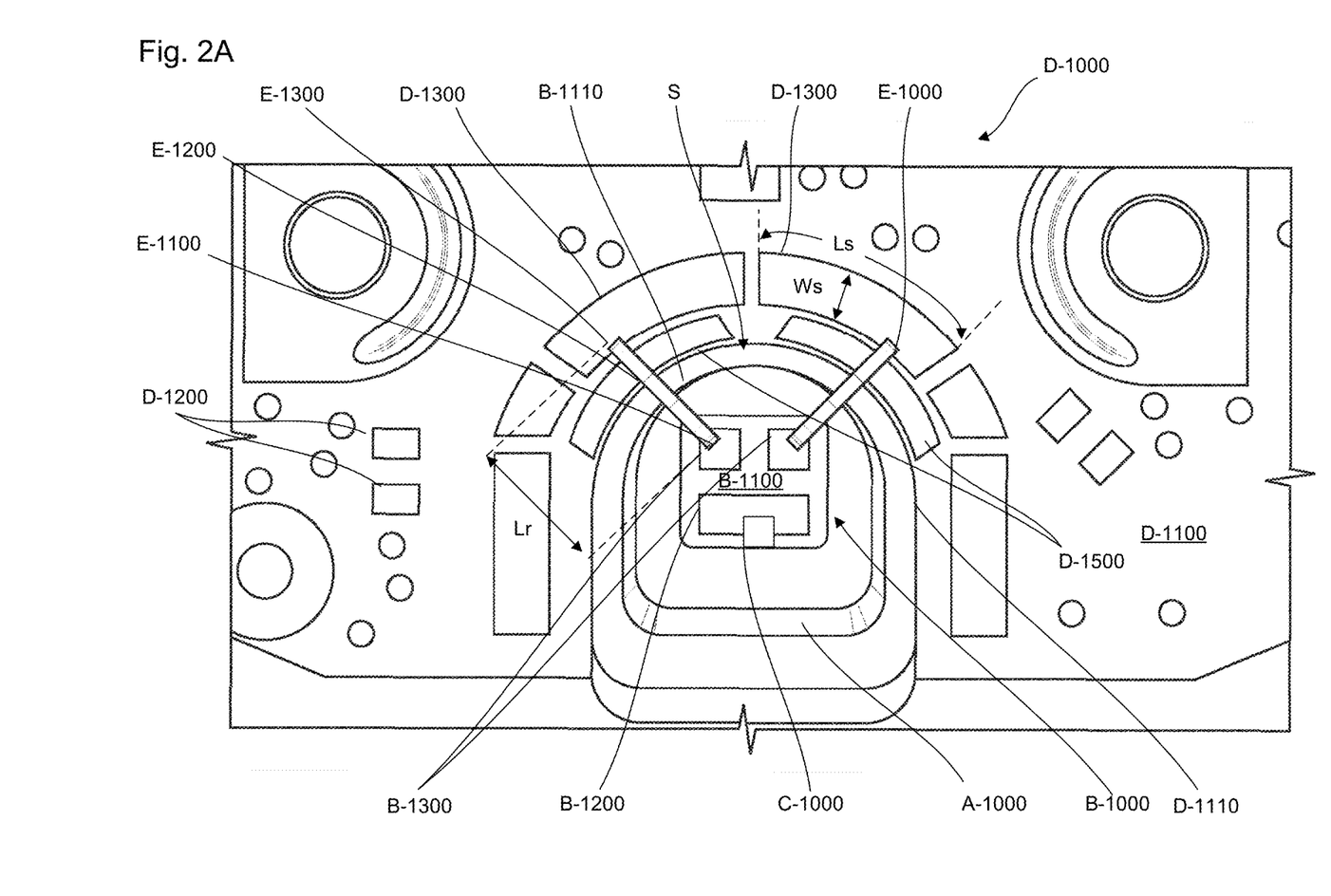
FIG. 2A is a top view of the light assembly of the lighting system in a undamaged state, according to certain aspects of the disclosure.
Figure 2B:
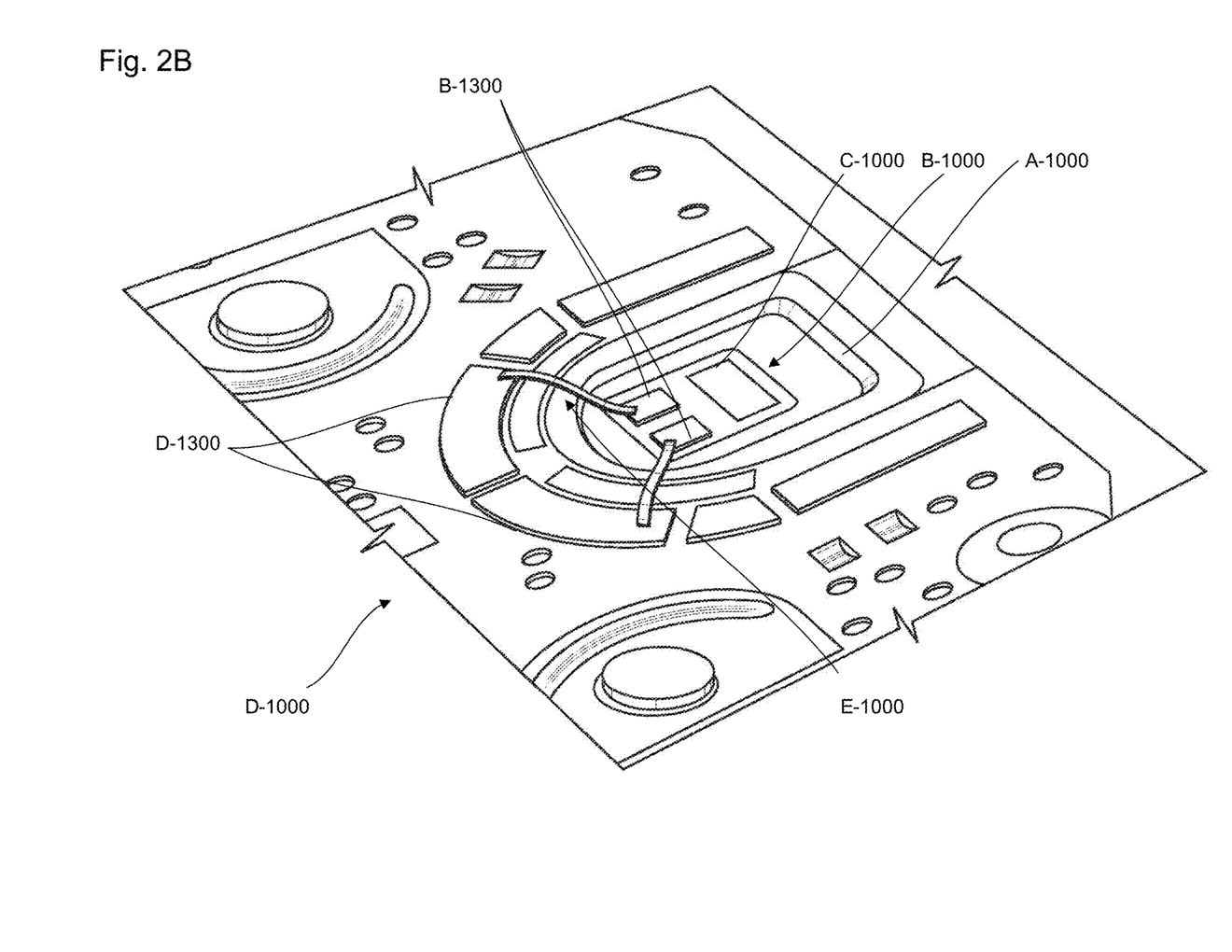
FIG. 2B is a perspective view of the light assembly of the lighting system in a undamaged state, according to certain aspects of the disclosure.
Figure 3A:
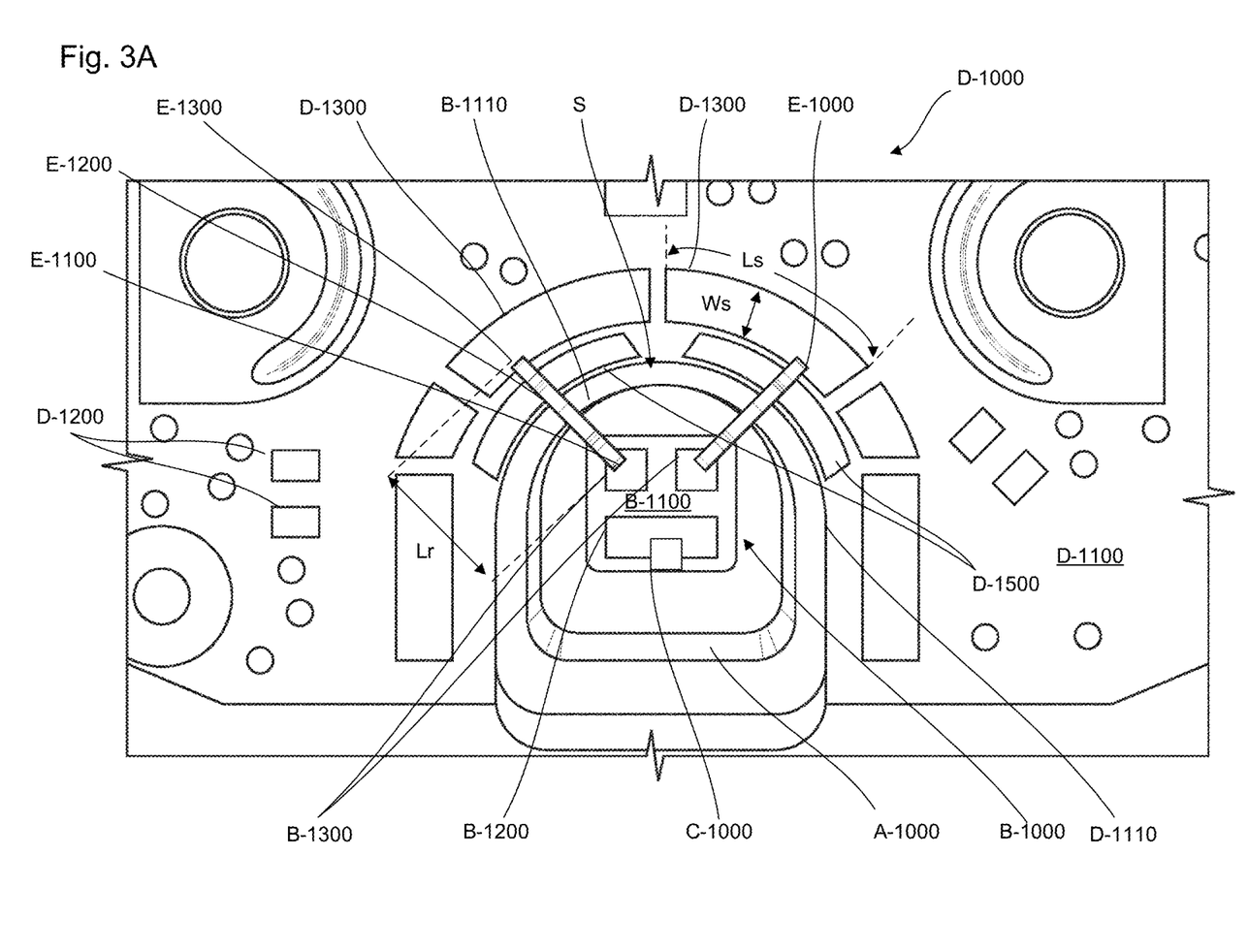
FIG. 3A is a top view of the light assembly of the lighting system in a damaged state, according to certain aspects of the disclosure.
Figure 3B:
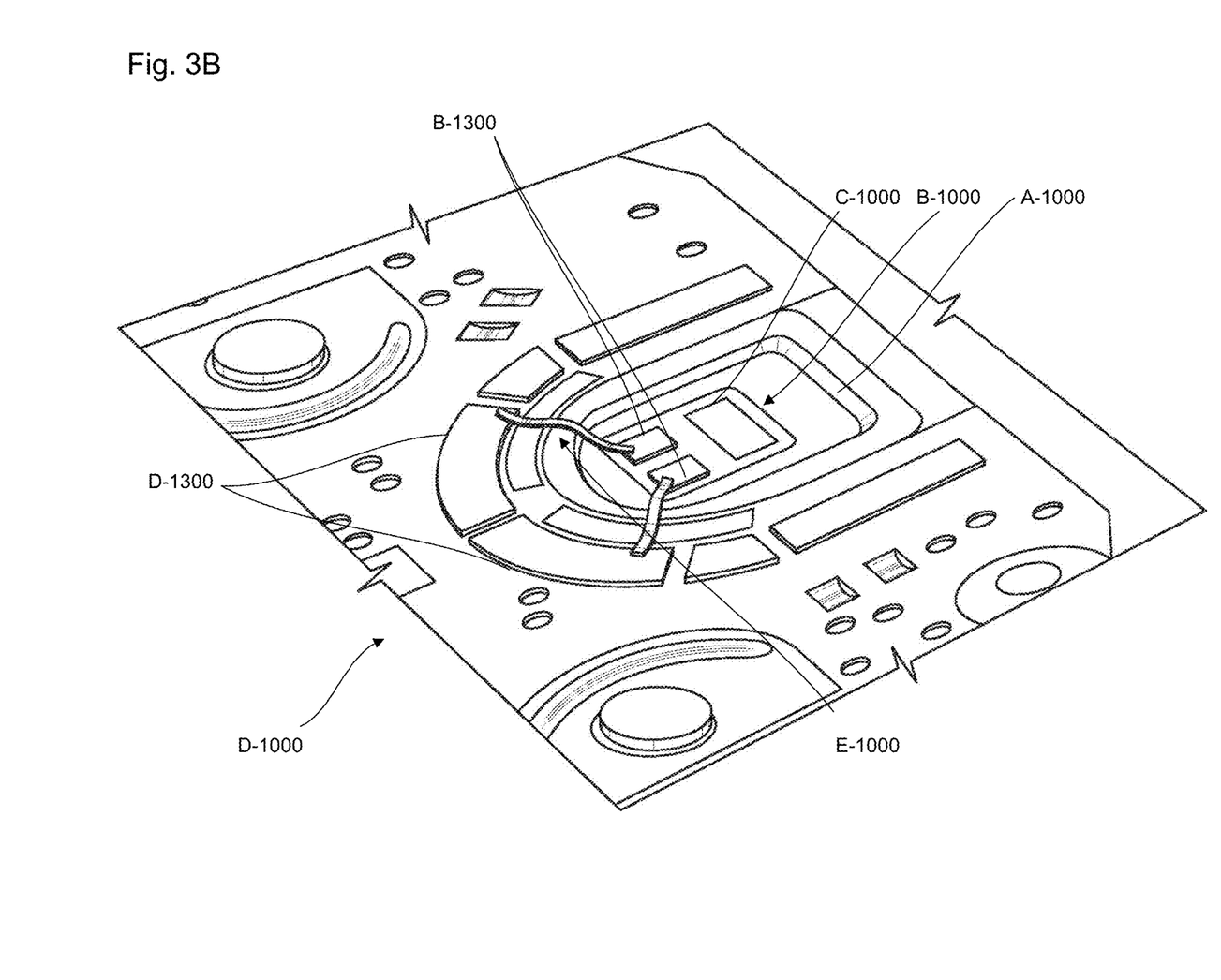
FIG. 3B is a perspective view of the light assembly of the lighting system in a damaged state, according to certain aspects of the disclosure.

FIGS. 2A-2B are a top view and a perspective view of the light assembly 1000 in an undamaged state, while FIGS. 3A-3B are a top view and a perspective view of the light assembly 1000 in a damaged state, according to certain aspects of the disclosure.

The light assembly 1000 can include a support assembly A-1000, a peripheral circuitry B-1000 affixed to the support assembly A-1000, light sources C-1000 mounted on the peripheral circuitry B-1000, a main circuitry D-1000, and a plurality of ribbons E-1000 joining the main circuitry D-1000 to the peripheral circuitry B-1000.

The light sources C-1000 can be light emitting diodes (LEDs), organic light emitting diodes (OLEDs), polymer light emitting diodes (PLEDs), monolithic LEDs, and/or any other type of lights that provides light for the lighting system 2000.

Alternatively, the light sources C-1000 can be representative of any sort of electronic elements, e.g. resistors, capacitors, motherboards, or the like.

The peripheral circuitry B-1000 can mechanically support and electrically connect the light sources C-1000 to the plurality of ribbons E-1000. The peripheral circuitry B-1000 can include a peripheral substrate B-1100, e.g. printed circuit boards, a plurality of peripheral electronic elements B-1200, e.g. capacitors, resistances, or the like, mounted on the peripheral substrate B-1100, a plurality of peripheral connection bands B-1300, and a plurality of peripheral conductive tracks (not shown) that provides electrical paths between the plurality of peripheral connection bands B-1300 and the light sources C-1000 and through the plurality of peripheral electronic elements B-1200.

The support assembly A-1000 can provide support for the peripheral circuitry B-1000 and/or the light sources C-1000 as well as dissipation of heat generated by the light sources C-1000 and/or the peripheral circuitry B-1000. The dissipation of heat generated by the light sources C-1000 and/or the peripheral circuitry B-1000 can improve reliability and prevent premature failures due to overheating, e.g. crack formations, unwanted electrical disconnections, and/or welding failures.

The main circuitry D-1000 can include a main substrate D-1100, e.g. printed circuit boards, a plurality of main electronic elements D-1200, e.g. capacitors, resistances, or the like, mounted on the main substrate D-1100, a plurality of main connection bands D-1300 that contacts the plurality of ribbons E-1000, and a plurality of main conductive tracks (not shown) that provides electrical paths between the power source 10, as illustrated in FIG. 1, and the main connection bands D-1300 and through the plurality of main electronic elements D-1200.

The main circuitry D-1000 is partially disconnected from the peripheral circuitry B-1000 to prevent heat transfer between the main circuitry D-1000 and the peripheral circuitry B-1000. The partial disconnection between the main circuitry D-1000 and the peripheral circuitry B-1000 can be provided by a spacing S between a peripheral edge portion B-1110 of the peripheral substrate B-1100 and a main edge portion D-1110 of the main substrate D-1100.

Each ribbon of the plurality of ribbons E-1000 can include a front portion E-1100 that can be affixed to the peripheral connection bands B-1300, a back portion E-1300 that can be affixed to the main connection bands D-1300, and a central portion E-1200 extending between the front portion E-1100 and the back portion E-1300.

In addition, the main circuitry D-1000 can include a plurality of detection bands D-1400 extending lengthways along the main edge portion D-1110 and crosswise between the plurality of main connection bands D-1300 and the main edge portion D-1110. The plurality of detection bands D-1400 are configured to generate short circuits when contacts occurred with the plurality of ribbons E-1000.

The short circuits generated by contacts between the plurality of ribbons E-1000 and the plurality of detection bands D-1400 can be detected by the diagnostic tool 50 via software instructions executed on the diagnostic tool 50.

The plurality of ribbons E-1000 can be made of electrically conductive and malleable materials such as metallic alloys, e.g. copper alloys, aluminum alloys, or the like, to step over the spacing S and provides electrical connections between the main circuitry D-1000 and the peripheral circuitry B-1000.

In addition, the plurality of ribbons E-1000 can be bare electrical conductor without insulating materials such as insulating sheaths to facilitate heat dissipation.

In the undamaged state, as illustrated in FIGS. 2A-2B, the plurality of ribbons E-1000 step over the spacing S without contacting the plurality of detection bands D-1400, the front portion E-1100 of each ribbon of the plurality of ribbons E-1000 contacts a corresponding peripheral connection band B-1300 of the plurality of peripheral connection bands B-1300, and the back portion E-1300 of each ribbon of the plurality of ribbons E-1000 contacts a corresponding main connection band of the plurality of main connection bands D-1300 to establish electrical connections between the peripheral circuitry B-1000 and the main circuitry D-1000.

In the damaged state, as illustrated in FIGS. 3A-3B, at least one ribbon of the plurality of ribbons E-1000 is sufficiently deformed, e.g. bent, smashed, crushed, or the like, and contacts at least one detection band of the plurality of detection bands D-1400 and generates a short circuit. This short circuit can be detected, e.g. by the diagnostic tool 50 as illustrated in FIG. 1, to indicate a possible disconnection issue between the peripheral circuitry B-1000 and the main circuitry D-1000.

The plurality of detection bands D-1400 can have geometrical characteristics, configurations and/or locations that facilitate the generation of electrical contact between the plurality of ribbons E-1000 and the plurality of detection bands D-1400.

For example, each detection band of the plurality of detection bands D-1400 can have an annular shape and/or semi-annular shape that extends laterally on each side of the central portion E-1200 of a corresponding ribbon of the plurality of ribbons E-1000. Each detection band D-1500 can be characterized by a predetermined curvilinear length Ls and a predetermined width Ws. The predetermined curvilinear length Ls and the predetermined width Ws are sufficiently small to prevent electrical contact between the plurality of main electronic elements D-1200 and the plurality of detection bands D-1400 from occurring when the ribbon E-1000 is not damaged and sufficiently large to enable electrical contacts between the plurality of ribbons E-1000 and the plurality of detection bands D-1400 to occur when at least one ribbon of the plurality of ribbons E-1000 is damaged in the forward, backward, and/or lateral directions.

For example, the predetermined curvilinear length Ls can be between 20% and 200%, and preferably between 50% and 150% of a length Lr of each ribbon E-1000, and the predetermined width We can be between 5% and 50%, and preferably between 20% and 40% of the length Lr.

While certain embodiments have been described, these embodiments have been presented by way of example only, and are not intended to limit the scope of the present disclosures. Indeed, the novel apparatuses and systems described herein can be embodied in a variety of other forms; furthermore, various omissions, substitutions and changes in the form of the apparatuses and systems described herein can be made without departing from the spirit of the present disclosures. The accompanying claims and their equivalents are intended to cover such forms or modifications as would fall within the scope and spirit of the present disclosures.

What is claimed is:

1. A circuitry assembly comprising:
   an electrical component;
   a peripheral circuitry that supports the electrical component;
   a support assembly affixed to the peripheral circuitry to evacuate heat excess generated by the electrical component and the peripheral circuitry;
   a main circuitry separated from the support assembly by a spacing, the main circuitry including:
      a plurality of detection bands; and
   a plurality of ribbons electrically connecting the peripheral circuitry with the main circuitry and deformable between an undamaged state and a damaged state, wherein
      in the undamaged state the plurality of ribbons steps over the spacing and the plurality of detection bands and in the damaged state at least one ribbon of the plurality of ribbons contacts at least one detection band of the plurality of detection bands and generate a short circuit.

2. The circuitry assembly of claim 1, wherein the support assembly is made of a metallic alloy.

3. The circuitry assembly of claim 1, wherein each ribbon of the plurality of ribbons is a bare electrical conductor.

4. The circuitry assembly of claim 3, wherein the bare electrical conductor is made of a malleable material.

5. The circuitry assembly of claim 1, wherein each detection band of the plurality of detection bands has a shape that follows the spacing.

6. The circuitry assembly of claim 5, wherein each detection band has a semi-annular shape.

7. The circuitry assembly of claim 6, wherein each detection band is characterized by a curvilinear length between 20% and 200% of a length of each ribbon of the plurality of ribbons.

8. The circuitry assembly of claim 1, wherein the electrical component is a light source.

9. A light assembly comprising:
a light source;
a peripheral circuitry that supports the light source;
a support assembly affixed to the light source;
a main circuitry separated from the support assembly by a spacing, the main circuitry including:
a plurality of detection bands; and
a plurality of ribbons electrically connecting the peripheral circuitry with the main circuitry and deformable between an undamaged state and a damaged state, wherein
in the undamaged state the plurality of ribbons steps over the spacing and the plurality of detection bands and in the damaged state at least one ribbon of the plurality of ribbons contacts at least one detection band of the plurality of detection bands and generate a short circuit.

10. The light assembly of claim 9, wherein each ribbon of the plurality of ribbons is a bare electrical conductor.

11. The light assembly of claim 10, wherein the bare electrical conductor is made of a malleable material.

12. The light assembly of claim 9, wherein each detection band of the plurality of detection bands has a shape that follows the spacing.

13. The light assembly of claim 12, wherein each detection band has a semi-annular shape.

14. The light assembly of claim 13, wherein each detection band is characterized by a curvilinear length between 20% and 200% of a length of each ribbon of the plurality of ribbons.

15. A lighting system for vehicle comprising:
a light source;
a peripheral circuitry that supports the light source;
a support assembly affixed to the light source;
a main circuitry separated from the support assembly by a spacing;
a power source coupled to the main circuitry to provide light functionality to the light source;
a plurality of detection bands;
a diagnostic tool operatively coupled to the plurality of detection bands; and
a plurality of ribbons electrically connecting the peripheral circuitry with the main circuitry and deformable between an undamaged state and a damaged state, wherein
in the undamaged state the plurality of ribbons steps over the spacing and the plurality of detection bands and in the damaged state at least one ribbon of the plurality of ribbons contacts at least one detection band of the plurality of detection bands and generate a short circuit detectable by the diagnostic tool.

16. The lighting system of claim 15, wherein each ribbon of the plurality of ribbons is a bare electrical conductor.

17. The lighting system of claim 16, wherein the bare electrical conductor is made of a malleable material.

18. The lighting system of claim 15, wherein each detection band of the plurality of detection bands has a shape that follows the spacing.

19. The lighting system of claim 18, wherein each detection band has a semi-annular shape.

20. The lighting system of claim 19, wherein each detection band is characterized by a curvilinear length between 20% and 200% of a length of each ribbon of the plurality of ribbons.

* * * * *